United States Patent [19]
Kroger et al.
[11] 3,831,185
[45] Aug. 20, 1974

[54] CONTROLLED INVERSION BISTABLE SWITCHING DIODE

[75] Inventors: Harry Kroger, Sudbury; Horst A. R. Wegener, Carlisle, both of Mass.
[73] Assignee: Sperry Rand Corporation, New York, N.Y.

[22] Filed: Apr. 25, 1973
[21] Appl. No.: 354,271

[52] U.S. Cl. .................... 357/6
[51] Int. Cl. .................... H01l 49/02
[58] Field of Search .................... 317/234

[56] References Cited
UNITED STATES PATENTS

| | | | |
|---|---|---|---|
| 3,206,670 | 9/1965 | Atalla | 323/93 |
| 3,502,953 | 3/1970 | Aronson | 317/238 |
| 3,569,799 | 3/1971 | Fang et al. | 317/235 |

*Primary Examiner*—Rudolph V. Rolinec
*Assistant Examiner*—E. Wojciechowicz
*Attorney, Agent, or Firm*—Howard P. Terry

[57] ABSTRACT

The bistable semiconductor diode switching device is provided with voltage controlled switching characteristics by use of a resistive non-linear impedance layer and by balancing injection of carriers with their rate of removal by conduction through the non-linear impedance layer.

15 Claims, 12 Drawing Figures

CONTROLLED INVERSION BISTABLE SWITCHING DIODE

BACKGROUND OF THE INVENTION

1. Field of the Invention

The invention generally relates to the field of stable semiconductor devices and is more particularly concerned with semiconductor diode structures having an abruptly switched transition in current carrying capacity at a threshold voltage.

2. Description of the Prior Art

Generally, prior art bistable semiconductor switching devices, of which the p–n–p–n and n–p–n–p diodes are typical examples, are complex and expensive to manufacture and provide switching of relatively small electrical currents with a reasonable degree of stability of the switch point only at relatively low temperatures. Rapid switching between widely differing impedance states at a temperature stable threshold voltage has not been generally achieved. Prior art four layer devices are generally slow in switching, especially from their low to their high impedance states. Rapid switching in four layer devices is generally achieved only with considerable added difficulty in fabrication. While prior art devices with three junctions have some advantages, they are awkward to incorporate in large scale integrated circuits.

SUMMARY OF THE INVENTION

The present invention relates to temperature stable semiconductor devices having an abruptly switchable transition in current carrying capacity at a temperature stable threshold voltage. Use is made of non-linear characteristics of a dielectric or resistive layer within the semiconductor device in a configuration that reliably balances the rate of injection of charges with their rate of removal through the non-linear resistive layer over a wide range of temperatures. Relatively high currents may be rapidly switched, and reliable switching may be obtained at a threshold value substantially independent of temperature. Precise control of the thicknesses of multiple layers is not required in order to achieve good switching speed.

DESCRIPTION OF THE PREFERRED EMBODIMENTS

Figure 1:
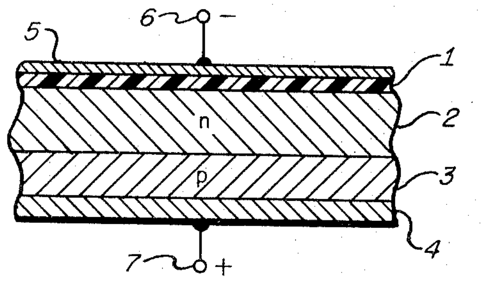
FIGS. 1 and 2 are elevation cross section views of alternative forms of the invention.
Figure 2:
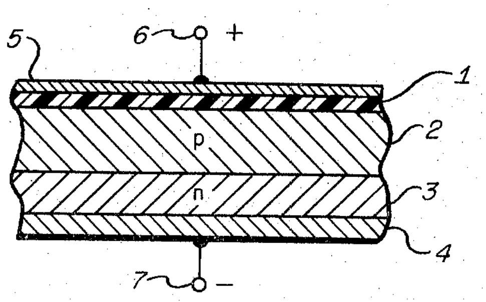

The novel bistable switching device shown in alternative forms in FIGS. 1 and 2 employs special non-linear resistance characteristics of a dielectric layer in a semiconductor diode configuration for abrupt current switching purposes. Referring to both of the FIGS. 1 and 2, which figures each represent sections of the alternative forms of the thin semiconductor diode, layer 1 is formed of a special non-linear resistive material, as will be described, and is placed upon a semiconductor body including the respective type $n$ and type $p$ conductivity layers 2 and 3. The non-linear resistive layer 1 is in both cases covered with a conductive metal layer 5 to which an ohmic lead 6 is attached. Opposite the non-linear resistive layer 1, there is formed on the semiconductor body comprising layers 2 and 3 a conductive metal layer 4 to which an ohmic lead 7 is attached. The respective type $n$ and type $p$ or $p^+$ layers 2 and 3 in FIG. 2 are reversed in position with respect to their positions in FIG. 1, and the bias voltages applied to the respective terminals 6 and 7 are reversed in FIG. 2. The substrate layer 3 in FIG. 1 may be, for example, a type $p$ or $p^+$ semiconductor layer with the type $n$ layer 2 epitaxially grown upon it in a conventional manner.

Referring particularly to the form of the invention illustrated in FIG. 1, a typical construction may be described as using silicon for the materials of layers 2 and 3 doped in a conventional manner and having respective thicknesses of approximately 2 and 15 microns. The non-linear resistive layer 1, which will be further discussed, will preferably be a silicon nitride or oxynitride layer 20 to 200 Angstroms thick and may be covered with a layer of evaporated molybdenum about $2 \times 10^{-5}$ to $2 \times 10^{-6}$ centimeters thick. The ohmic layer 4 at the base of the semiconductor layer 3 may be formed in the usual manner of a layer of evaporated chromium about $2 \times 10^{-6}$ centimeters thick. Representative areas of each of the layer interfaces are $5 \times 10^{-4}$ square centimeters, though devices with smaller or larger areas may readily be made.

Materials which display the suitable non-linear resistive properties desired for layer 1 may include insulative materials such as silicon nitride, silicon oxynitride, silicon-rich silicon nitride, or silicon-rich silicon oxynitride, or mixtures thereof, materials which will herein be generally classified as nitrides of silicon. In general, controlled methods for formation of desirable layers of such non-linear resistive materials are similar to those established in the art; for example, production of a silicon nitride layer on a semiconductor substrate is taught generally in the U.S. Pat. No. 3,573,096, issued Mar. 30, 1971 to N. C. Tombs for a "Silane Method of Making Silicon Nitride," assigned to Sperry Rand Corporation. Also of general interest are the N. C. Tombs U.S. Pat. No. 3,422,321, issued Jan. 14, 1969 for "Oxygenated Silicon Nitride Semiconductor Device and Silane Method of Making Same," and the R. I. Frank and W. L. Moberg U.S. Pat. No. 3,629,088, issued Dec. 21, 1971 for a "Sputtering Method for Deposit of Silicon Oxynitride," both patents being assigned to Sperry Rand Corporation.

Figure 3:
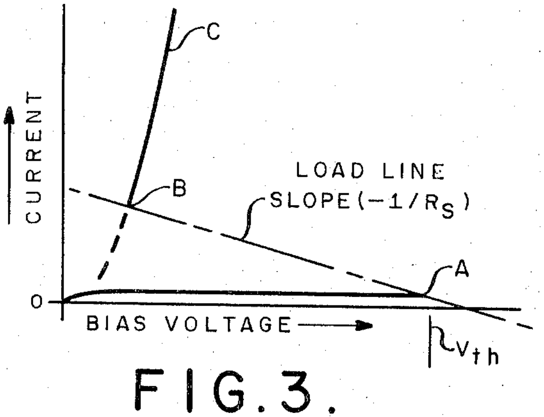
FIG. 3 is a graph useful in explaining operation of the invention.
Figure 4:
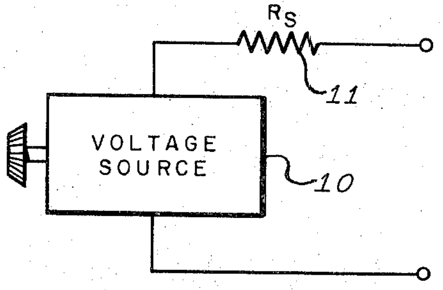
FIG. 4 illustrates an equivalent circuit of a bias voltage supply.

When voltage-biased in the respective senses indicated in FIGS. 1 and 2, both structures demonstrate the abrupt switching characteristics graphically illustrated in FIG. 3. A device initially placed in the zero bias voltage condition will follow the current-voltage characteristic of curve O – A of FIG. 3 as the bias is increased until the bias voltage reaches a maximum or threshold voltage $V_{th}$. Assuming that the adjustable bias voltage source 10 has an effective source resistance 11 equal to $R_S$, an abrupt switching mechanism will operate if an attempt is made to increase the bias voltage above the value $V_{th}$. The switching event manifests itself as a rapid transition from a high to a low impedance state characterized by the curve B–C of FIG. 3. The smallest or sustaining current flow $I_S$ is determined by the intersection of curve B–C with the load line A–B. The load line A–B is defined as having a slope equal to $-1/R_S$.

It is found experimentally that the largely resistive impedance of the non-linear layer 1 and therefore of the diode can change in less than 5 nonoseconds between the two states by a factor as great as $10^5$ to $10^7$. For instance, in the aforementioned example of a device having a metal layer 5 with an area of $5 \times 10^{-4}$ quare centimeters, the metal layer 5 being evaporated on an oxynitride layer 1 of $2 \times 10^{-5}$ centimeters thickness residing, in turn, on a silicon p–n body 2, 3, the high impedance state of the diode presented a resistance of greater than $10^6$ ohms, while its low impedance state had a resistance of less than 50 ohms.

It will be seen that a novel feature dominating the operating characteristics of the bistable diode lies in the nature of the conducting mechanism within insulative layer 1. The device of FIG. 1 is again shown, for example, in FIG. 5 where it will be further discussed in relation to the graphs of FIGS. 6, 7, and 8, which graphs plot the amplitude of the electric field along the device under three differing circumstances.

Figures 5, 6:
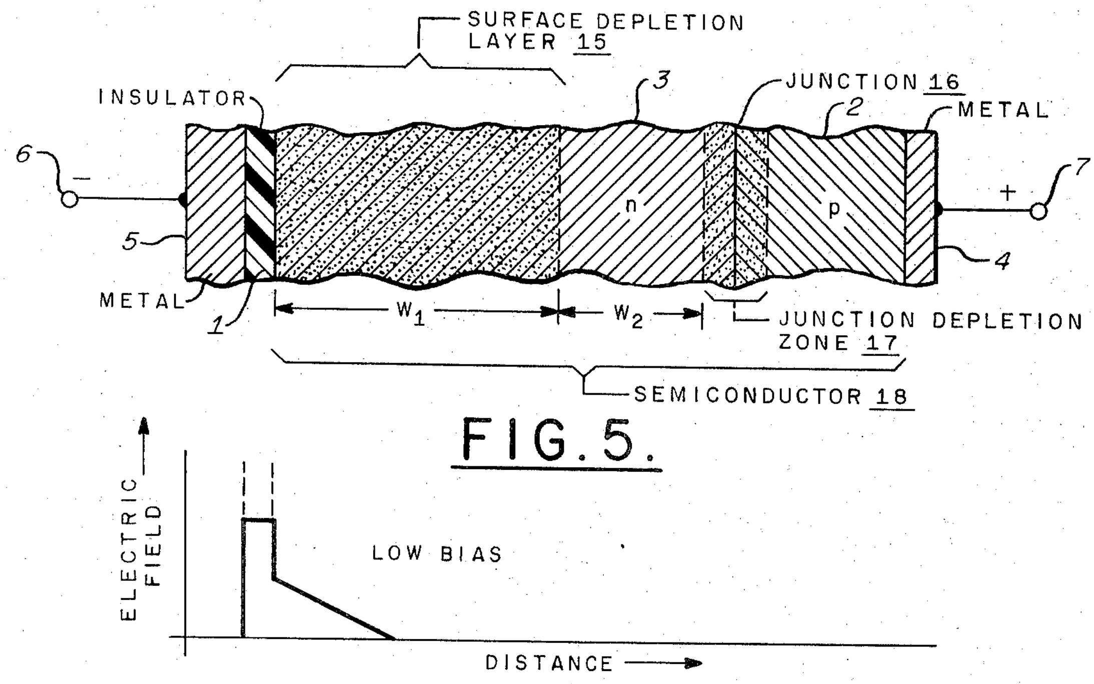
FIG. 5 is a drawing similar to FIG. 1 additionally showing depletion layers of interest in explaining the operation of the device.
FIGS. 6, 7, and 8 are graphs useful in explaining how electric fields are distributed in the invention.
Figure 7:
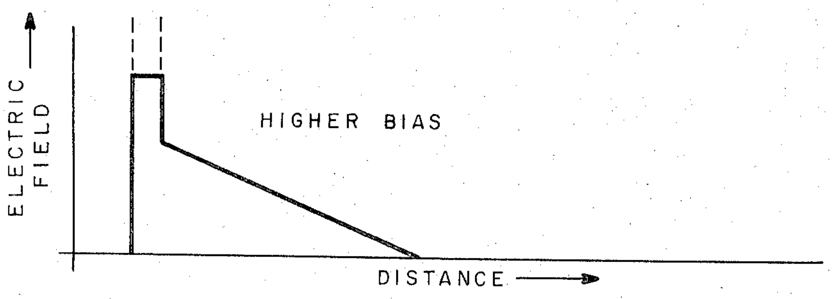

Starting with the zero bias voltage situation, the high impedance state of the diode is characterized in FIGS. 6 and 7 by a widening depletion zone 15 within the type *n* layer 3 adjacent non-linear resistive layer 1. As the field is increased from the FIG. 6 to the FIG. 7 situation, the depletion layer 15 extends to a distance $W_1$ from non-linear layer 1. When the bias voltage almost reaches the threshold voltage value $V_{th}$, the depletion layer 15 has a steady state width $W_1$ much greater than it could have if the non-linear resistive layer 1 were a pure insulator; evidently, an undesired inversion layer would of necessity form at the surface of semiconductor layer 3 common with layer 1 if that insulative layer did not contact at all. For the device of the aforementioned example, and if the non-linear layer 1 were a pure insulator, a steady state width for the depletion layer 15 of about one micron could exist for a doping level of $6 \times 10^{14}$ per cubic centimeter with a material such as phosphorous or arsenic used as a dopant in the type *n* silicon layer before such a strong inversion would occur. The inversion event would limit further extension of the depletion layer 15 if the material of layer 1 was a pure insulator. In addition, inversion layer formation would cause almost all of the total voltage drop to appear across the non-linear layer 1; with the typical layer thickness of $2 \times 10^{-7}$ centimeters, a bias voltage even as low as 50 volts would irreversibly damage the insulative layer 1 under such operating conditions.

In the present invention, the depletion layer 15 of FIG. 5 is allowed to increase in extent in the high impedance state of the device, permitting the existence of a high value of the threshold voltage $V_{th}$, and such is accomplished because an inversion layer is not permitted to form. In its high impedance state, the only possible mechanism for preventing the formation of the undesired inversion layer is actual controlled conduction of electrons through the non-linear resistive layer 1. Conduction through the non-linear resistive layer 1 in the high impedance state is in sufficient quantity to annihilate the carriers that would form an inversion layer at the interface between non-linear layer 1 and semiconductor layer 3. The exact mechanism of operation may differ at least in detail, and the discussion of it herein is not intended to be interpreted in a limiting sense.

Figure 8:
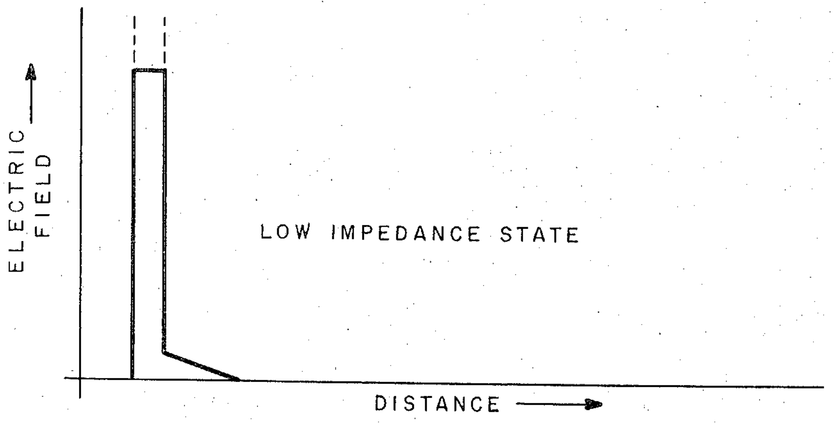

At all times, except during the actual instant of transition between high and low impedance states, the device of the present invention is in a state of dynamic equilibrium expressed by the requirement of steady-state current continuity. If the bias voltage applied to terminals 6, 7 is increased to a value with respect to $V_{th}$ which prohibits current continuity, then switching must occur to achieve a new internal state of electric field distribution, as seen in FIG. 8, a state in which current continuity throughout the device again prevails. The conduction of the non-linear layer 1 is greatly increased in the low impedance state, not only because of the higher electric field associated with the inversion, but also because of the highly non-linear conductivity nature of layer 1, as will be discussed.

The new steady state low-impedance condition is characterized by a greatly increased voltage drop across the layer 1, a requirement that can be realized only if an inversion layer is now actually formed at the layer 1 by the increased rate of arrival of minority carriers injected by the junction 16 of FIG. 5. The low-impedance state is thus marked by a relatively low voltage across the device, even though the electric field across the non-linear layer 1 is high. The new equilibrium is achieved only when the electric field across the non-linear layer 1 is great enough that minority carriers are moved rapidly from the junction depletion region 16 through layer 1 as fast as the junction 16 may supply them. The field shown in FIG. 8 across layer 1 may be as high as $10^7$ volts per centimeter, so that the dielectric strength of the layer 1 should be selected to be as high as possible to prevent catastrophic breakdown therethrough.

It is thus seen that the conductance of the novel device is controlled by the semiconductor's surface depletion zone 15. In the high impedance state, the device has large depletion layer widths with no inversion layer formation until the bias is nearly equal to the threshold value $V_{th}$. The normal tendency to form an inversion layer is thwarted by a small but finite current conducted through the non-linear layer 1. In the low impedance state, on the other hand, the semiconductor surface is strongly inverted with a collapsed depletion zone. It will also be understood that, if the ratio of current in the low impedance state to the current in the high impedance state is to be high or a given dielectric strength of the non-linear layer 1, the material thereof must demonstrate highly non-linear characteristics with greatest conductance occurring at high fields.

A further feature of the novel diode lies in the flexibility of choice of the threshold voltage $V_{th}$; the value of $V_{th}$ may be increased by increasing the total thickness of the semiconductor epitaxial layer 3 if doping density is held constant, and vice versa. For instance, in the aforementioned example, it is found possible to change the threshold voltage $V_{th}$ from 40 to 3 volts simply by changing the total thickness of layer 3 from 12 to 2 for a typical dopant density of $6 \times 10^{14}$ per cubic centimeter. Further, with layer thickness being held constant, it is readily possible to change dopant density within layer 2, an increase in dopant density providing an increased threshold voltage, unless reverse breakdown occurs.

The threshold voltage $V_{th}$ is always less than that voltage required completely to deplete the type *n* region 3, which is the punch-through voltage. The punch-through voltage is always less than the avalanche breakdown voltage. Variation of the voltage across the surface depletion zone affects not only the conductance of the non-linear layer 1, but also the rate of hole injection from the p–n or $p^+$–n junction into the epitaxial type *n* layer 3, even though punch-through does not occur. Higher applied biases reduce the width of the neutral (undepleted) type *n* layer 3 between the junction 16 and surface depletion zone 15. Physically, the threshold voltage $V_{th}$ is attained when the current supplied by the junction 16 is so great that the current through the non-linear layer 1 can not keep pace with it. Thus, current continuity can not be maintained across the entire device without an internal rearrangement of the field distribution.

A further important feature of the invention lies in the ease with which relatively good temperature stability of the switching threshold voltage $V_{th}$ may be achieved by the use of certain compensatory effects. Use is made in the invention of an understanding of the dynamic equilibrium which may exist between the arrival and removal at the insulator-semiconductor interface (the interface between layers 1 and 3) for a device biased just below the threshold temperature $V_{th}$ at a given temperature. At such a bias condition for the uncompensated device, the conductance of non-linear layer 1 is just sufficient to remove the minority carriers from this interface at the same rate as they arrive without the formation of the inversion region within semiconductor layer 3 at layer 1. Now, if the temperature is raised by a small increment, it is found that the rate of arrival of minority carriers injected by junction 16 increases more rapidly than the rate of removal by conduction through non-linear layer 1 and an inversion layer must form, causing the device rapidly to switch to its low impedance state. In the compensated device, the construction is so arranged that the rate of arrival of minority carriers injected by junction 16 remains substantially the same over a relatively wide temperature range as their rate of removal by conduction through non-linear layer 1. In order to achieve the demonstrated temperature stability, tunneling is therefore not used as a conduction mechanism.

Thus, relatively temperature-stable switching operation is achieved by the use of a material for non-linear layer 1 which has a temperature dependence matching that of the semiconductor. Conventional Frankl-Poole or conventional Schottky emission, for example, generally result in a better match over a range of temperature to the injection current of the semiconductor p–n junction 16 and therefore provide a desirable reduction in temperature sensitivity of the threshold voltage $V_{th}$.

The conductance of the non-linear layer 1, by the proper choice of a material such as silicon nitride or silicon oxynitride, is made to depend non-linearly upon the electric field strength across layer 1 to the extent that, when an inversion layer is formed in semiconductor layer 3, the non-linear layer 1 can pass large current densities at electric field that are far enough below its electrical breakdown strength that the layer is not damaged. A vapor deposited high resistance silicon nitride layer 1 rather than a thermally grown silica layer offers significantly improved thermal stability of the threshold voltage $V_{th}$ because of the desired greater density of traps introduced by vapor deposition. Such traps result in a predominantly field-assisted thermal-emission controlled conductivity, for example, whose temperature dependence closely matches the temperature characteristic of the forward biased junction, resulting in a threshold voltage $V_{th}$ substantially independent of temperature.

Specifically, the choice of a vapor deposited silicon oxynitride having an average visible optical index of refraction about 1.75 is advantageous for use as layer 1 also because of its high dielectric strength. For example, such silicon oxynitride layers may readily be grown reproducibly which have dielectric strengths in excess of $2 \times 10^7$ volts per centimeter. Because of this high dielectric strength, high electric fields may be imposed across non-linear layer 1, which permits currents of densities in excess of 200 amperes per square centimeter to flow through the thin layer 1 without damage thereto. More highly conductive nitride layers have also been used with success.

A preferred method of making the non-linear layer 1 from silicon oxynitride so that it has the desired non-linear conductivity and dielectric strength properties is by a pyrolytic deposition method that is a variant of prior art methods for generating highly insulating passivating layers and the like. In constructing the device of FIG. 1 with a silicon oxynitride layer 1, the reaction of silane, ammonia, and nitrous oxide is carried out, for example, in a horizontal quartz reactor tube in which the semiconductor body 2, 3 has been supported with the exposed surface to be coated prepared by mechanical polishing and cleaning. The temperature of the body 2, 3 within the reactor is elevated in the presence of a flow of reagent gas. The preferred composition of the reagent gas during deposition is substantially 0.04 percent by volume silane ($SiH_4$), percent by volume of ammonia ($NH_3$), and 0.25 percent of nitrous oxide ($N_2O$), with the remaining part of the volume being argon as an inert carrier. The total rate of flow of the reagent gas through the reactor vessel is about 10 liters per minute with the silicon semiconductor body being held at 700° C, for example. The thickness of the layer thus formed is generally proportional to the time that the treated surface of the body 2, 3 is exposed to the reagent gas, being typically 20 Angstroms after a 30 second exposure.

Other similar non-linear resistive materials may be employed, such as silicon nitride, which may also be grown pyrolytically. In this instance, the composition of the reagent gas may be 0.2 percent of silane and 2 percent ammonia with the bulk of the volume again provided by argon. The total flow of the gas through a horizontal reactor may be approximately 10 liters per minute with the temperature of the semiconductor body 2, 3 at 700° C. The time required to deposit 200 Angstroms of silicon nitride in this situation is about 20 seconds. A range of reagent gas constituent variation may involve the variation in silane content from 0.004 to 4 percent by volume while maintaining the ammonia component constant at 4 percent. Independent variation of the nitrous oxide may cover a range of 0.004 to 0.4 percent by volume.

The preferred trap depth in the non-linear resistive layer 1 should match the band gap for the semiconductor. For example, it should be 1.12 electron volts if the semiconductor material is silicon or 0.67 electron volts when germanium is employed. For silicon devices, the average visible optical index of refraction of layer 1 may be substantially 1.7 and the dielectric strength $2.0 \times 10^7$ volts per centimeter.

Silicon-rich silicon nitride may be used in a temperature stable layer 1 having an average visible optical index of refraction about 2.1, and a dielectric strength of $10^7$ volts per centimeter. Because of the relatively high conductivity of silicon-rich silicon nitride, relatively thick layers (200 angstroms or more) can readily be deposited without sacrifice of device performance. Layers 100 to 200 Angstroms thick are advantageous because conductivity is less sensitive to surface defects than in the case of 10 to 50 Angstrom layers.

The molybdenum contact layers 4 and 5 may be formed by evaporation, especially if the non-linear layer 1 is thin, molybdenum being highly adherent to insulative layers. The molybdenum layers 4 and 5 may further be coated in the conventional manner with gold to protect the molybdenum from deterioration due to oxidation and to increase the ease of compression bonding of leads 6 and 7 to the device. In the instance of a relatively thick non-linear layer 1, the molybdenum layer 4 may be replaced by a thin evaporated layer of chromium (about 400 Angstroms thick) covered by a layer of evaporated gold (about 2,000 Angstroms thick) to which lead 6 is directly attached by soldering or by thermocompression.

Figure 9:
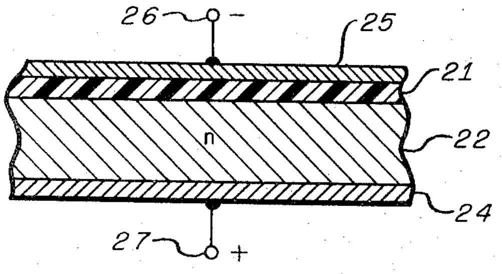
FIGS. 9 and 10 are elevation cross section views illustrating further alternative embodiments of the invention.
Figure 10:
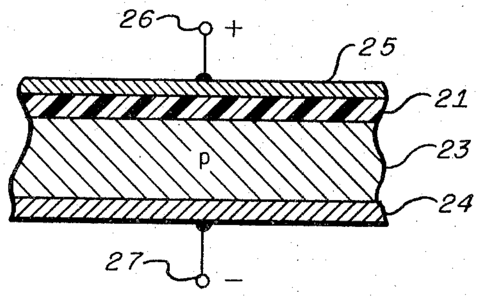

Similar temperature stable switching devices may be constructed as in FIGS. 9 and 10 in which the p–n and n–p junctions 2, 3 of FIGS. 1 and 2 are beneficially replaced by Schottky metal barrier emitters. Referring to both of the FIGS. 9 and 10, which figures represent sections of alternate forms of the thin semiconductor diode, layer 21 is formed of non-linear resistive material such as silicon nitride, silicon oxynitride, or the like, and is placed upon a semiconductor layer. Layer 22 of FIG. 9 is of the *n* conductivity type, whereas layer 23 of FIG. 10 is of the *p* conductivity type. The non-linear layer 21 is in both cases covered with a conductive metal layer 25 to which an ohmic lead 26 is attached. Opposite the non-linear layer 21, there is formed on the respective semiconductor layers 22 and 23 a conductive metal layer 24 to which ohmic leads 27 are attached. The bias voltages applied to the respective leads 26 and 27 in the two figures are reversed. It is seen that FIG. 9 is analogous to FIG. 1, but that the junction between semiconductor layers 2 and 3 is discarded to be replaced by a Schottky barrier interface lying between the *n* type semiconductor layer 22, which may be silicon, and metal layer 24. In a similar manner, the structure of FIG. 10 is analogous to that of FIG. 2, but the junction between semiconductor layers 2 and 3 is again absent, being replaced by a barrier interface lying between the type *p* semiconductor layer 23, which may be silicon, and the metal layer 24. The respective metal layers 24, 24 are chosen in a conventional manner with respect to composition and to method of formation so as to form Schottky barriers with the respective underlying semiconductor layers 22 and 23. The platinum silicide Schottky barriers are fabricated, for example, on silicon wafers of about 10 micron thickness and having a conductivity typically about 5 ohm centimeters for type *n* silicon. The insulative layer 21 may be a 25 Angstrom thick layer of silicon oxynitride formed as discussed in the foregoing at 700° C to have an average visible optical refractive index of about 1.7.

It is found that the Schottky barrier associated with metal layers 24, 24 permits stable operation of the invention at relatively higher temperature as well as affording greater temperature stability. In addition, manufacture is simplified, since no high temperature diffusion or other such steps need be used and epitaxial deposition is not needed. Experimental results indicate that operation is otherwise generally similar to the operation of the apparatus of FIGS. 1 and 2. However, the Schottky barriers are used in this novel application primarily as minority carrier generators, rather than in the usual manner as majority carrier injection devices. In the present invention, the barrier delivers minority carriers to the semiconductor layer 22 (or 23) from the metal layer 24.

To understand how the properties of the Schottky barrier are exploited in the present invention, it is recalled to mind that conduction through a Schottky barrier varies with temperature substantially as $e^{-\phi/kT}$, where $\phi$ is the conventional barrier height, T is absolute temperature, and $k$ is Boltzmann's constant. On the other hand, conduction across a typical p–n junction such as employed in FIGS. 1 and 2 is well known to vary with temperature as $e^{-E_g/kt}$, where $E_g$ is the conventional band gap value. Normally, $E_g$ is considerably greater than $\phi$, so that the temperature dependency of Schottky injection is less severe than the temperature dependency of injection across a typical p–n junction.

The primary dependence upon temperature of the conductivity of common insulators, including non-linear resistive materials such as silicon nitride and silicon oxynitride, is proportional to $e^{-\phi_t/kT}$, where $\phi_t$ is the conventional trap level value. This trap level can readily be made to lie between 0.1 and 1.5 electron volts. The Schottky barrier height may also readily be made to match a given trap depth in the non-linear layer 21. This barrier height may be determined by the conventional method of selection of the electrode metal or by using an alloy of two or more metals whose relative proportions are chosen so that the resulting barrier height has the desired value. It is thus apparent that a compensating situation is achieved according to the present invention in the structures of FIGS. 9 and 10 such that there is a balance between the thermal variation of conductivity of non-linear layer 21 with the temperature variation of the conductivity of the barrier injection mechanism, resulting in relative temperature independence of the threshold voltage $V_{th}$ of the diode.

Figure 11:
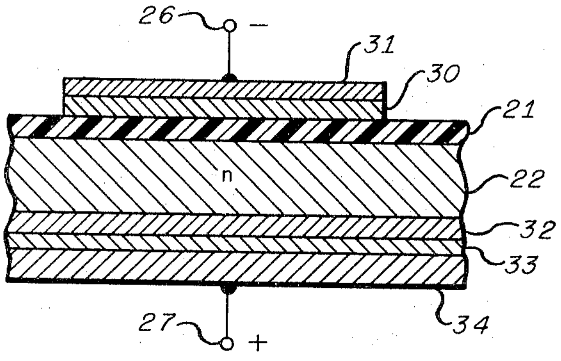
FIG. 11 is an elevation cross section view of a further form of the embodiments of FIGS. 9 and 10.
Figure 12:
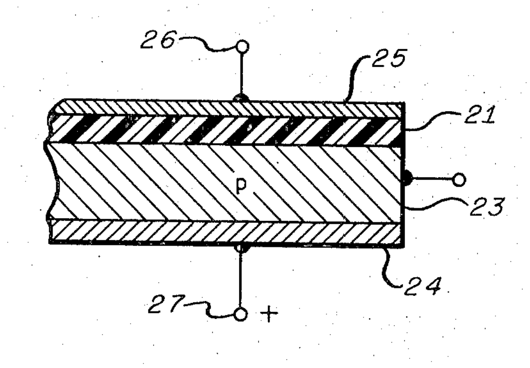

FIG. 11 illustrates one further practical form of the invention of FIG. 9; it will be apparent to those skilled in the art that the FIG. 10 configuration may also be constructed using similar techniques. In FIG. 11, for example, a 5 ohm type *n* silicon wafer 22 is employed which is about 8 to 10 microns thick. A non-linear high resistance layer 21 is constructed on one surface of wafer or layer 22, as previously discussed, and a 2,000 Angstrom layer 30 of molybdenum which which adheres firmly to the non-linear resistive material of layer 21 may be evaporated thereon, which layer 30 is then covered by the 5,000 Angstrom ohmic gold contact layer 31 to which lead 26 is attached. The platinum silicide layer 32 may be generated in a conventional manner and may conveniently be coated with a 400 Angstrom layer 33 of chromium which serves to bond a 2,000 Angstrom gold layer 34 firmly to layer 33. The chromium and gold layers 33 and 34 are used primarily to facilitate the bonding of lead 27 to the diode or to enable easy soldering thereto. It will be understood that the dimensions and proportions used in the several figures are used with a view of presenting the invention with clarity, and are not necessarily the dimensions or proportions which would be used in constructing the device of the invention for a particular application.

For ease in understanding the present invention, the phrases non-linear materials, non-linear resistive materials, and the like are intended to refer to a particular class of materials of which pyrolytically deposited silicon nitride and silicon oxynitride are examples. These materials exhibit conduction at high applied electric fields, and very little or no conduction at relatively low applied electric fields. They may also present significant non-linearity of conduction under different electric field gradients with respect to a threshold voltage which demarks low and high impedance states.

While the invention has been described in its preferred embodiments, it is to be understood that the words which have been used are words of description rather than of limitation and that changes within the purview of the appended claims may be made without departing from the true scope and spirit of the invention in its broader aspects.

We claim:

1. Semiconductor diode means comprising in series relation:

semiconductor body means having first and second surfaces, non-linear resistive layer means affixed to said first surface, conductive metal layer means affixed to said non-linear resistive layer means opposite said semiconductor body means, connector means adapted for applying a control voltage across said semiconductor diode means, and minority carrier generator means within said semiconductor body means for generating an inversion layer within said semiconductor body means at said non-linear resistive layer means when said control voltage reaches a predetermined threshold voltage value, said non-linear resistive layer means preventing formation of said inversion layer when said control voltage remains below said predetermined threshold voltage value.

2. Semiconductor diode means as described in claim 1 wherein said non-linear resistive layer comprises material that demonstrates a low impedance state in the presence of said control voltage above said predetermined threshold voltage level.

3. Semiconductor diode means as described in claim 2 wherein said non-linear resistive material demonstrates a high impedance state in the presence of said control voltage below said predetermined threshold voltage level.

4. Semiconductor diode means as described in claim 1 wherein said semiconductor body means comprises silicon.

5. Semiconductor diode means as described in claim 1 wherein said non-linear resistive layer means comprises a pyrolytically deposited nitride of silicon.

6. Semiconductor diode means as described in claim 5 wherein said non-linear resistive layer means is characterized by a trap depth matching the band gap of said semiconductor body means.

7. Semiconductor diode means as described in claim 6 wherein said non-linear resistive layer means comprises a material selected from the group including silicon nitride, silicon oxynitride, silicon-rich silicon nitride, silicon-rich silicon oxynitride, or mixtures thereof.

8. Semiconductor diode means as described in claim 1 wherein said conductive metal layer means comprises evaporated molybdenum.

9. Semiconductor diode means as described in claim 1 wherein said carrier generator means comprises junction emitter means.

10. Semiconductor diode means comprising:

semiconductor body means having first and second surfaces, non-linear resistive layer means affixed to said first surface, said non-linear resistive layer means having voltage sensitive non-linear impedance properties and comprising at least one pyrolytically deposited nitride of silicon, conductive metal layer means affixed to said non-linear resistive layer means opposite said semiconductor means, and minority carrier generator means within said semiconductor body means adapted to be responsive to the strength of an electric field placed across said semiconductor diode means for converting said non-linear resistive layer between first and second states of conductivity.

11. Semiconductor diode means as described in claim 10 wherein said non-linear resistive layer means is characterized by a trap depth factor lying between 0.6 and 1.5 electron volts.

12. Semiconductor diode means as described in claim 10 wherein said non-linear resistive layer means comprises a material selected from the group including silicon nitride, silicon oxynitride, silicon-rich silicon nitride, silicon-rich silicon oxynitride, and mixtures thereof.

13. Semiconductor diode means as described in claim 12 wherein said conductive metal layer means comprises evaporated molybdenum.

14. Semiconductor diode means as described in claim 12 wherein said minority carrier generator means comprises junction emitter means.

15. Semiconductor diode means as described in claim 12 wherein said minority carrier generator means provides means for generating a substantial inversion layer within said semiconductor body means at said non-linear resistive layer means in a first state of said conductivity and substantially no inversion layer within said semiconductor body means at said non-linear resistive layer means in a second state of said conductivity.

* * * * *